(12) United States Patent
Guzman-Casillas et al.

(10) Patent No.: US 8,031,447 B2
(45) Date of Patent: Oct. 4, 2011

(54) TRANSFORMER THROUGH-FAULT CURRENT MONITOR

(75) Inventors: Armando Guzman-Casillas, Pullman, WA (US); Normann Fischer, Colfax, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 553 days.

(21) Appl. No.: 12/247,911

(22) Filed: Oct. 8, 2008

(65) Prior Publication Data

US 2009/0091867 A1    Apr. 9, 2009

Related U.S. Application Data

(60) Provisional application No. 60/978,660, filed on Oct. 9, 2007.

(51) Int. Cl.
*H02H 7/04* (2006.01)
*H02H 3/08* (2006.01)
*H02H 9/02* (2006.01)

(52) U.S. Cl. ......................... 361/35; 361/93.1
(58) Field of Classification Search ............... 361/35
See application file for complete search history.

(56) References Cited

U.S. PATENT DOCUMENTS

| | | | |
|---|---|---|---|
| 4,204,237 A | 5/1980 | Zocholl | |
| 4,229,694 A | 10/1980 | Wilson | |
| 4,402,028 A | 8/1983 | Udren | |
| 4,758,774 A | 7/1988 | Crawford | |
| 4,825,326 A | 4/1989 | Andow | |
| 4,841,405 A | 6/1989 | Udren | |
| 5,014,153 A | 5/1991 | Wilkerson | |
| 5,115,226 A | 5/1992 | Schweitzer | |
| 5,276,402 A | 1/1994 | Schucht | |
| 5,309,312 A | 5/1994 | Wilkerson | |
| 5,597,403 A * | 1/1997 | Hankins | 96/23 |
| 5,602,707 A | 2/1997 | Schweitzer | |
| 5,703,745 A | 12/1997 | Roberts | |
| 5,784,233 A | 7/1998 | Bastard | |
| 5,790,357 A | 8/1998 | Schiel | |

(Continued)

FOREIGN PATENT DOCUMENTS

GB    2362275    11/2001

(Continued)

OTHER PUBLICATIONS

Yonghong Chen, Xing Liu, Vaithianathan Venkatasubramanian, Fast Algorithms for Detecting Circular VAR Flows in Large Power-Flow Models, Proceedings of the 41st Hawaii International Conference on System Sciences, Jan. 7-10 2008.

(Continued)

*Primary Examiner* — Dharti Patel
(74) *Attorney, Agent, or Firm* — Eugene M. Cummings, PC

(57) ABSTRACT

A device is provided for monitoring through-fault current in an electric transformer on an electrical power system. The device generally includes a magnitude calculator for calculating the magnitude of current (e.g., a root means square value of current or magnitude of a fundamental of current) based on the current through the electric transformer. A through-fault energy calculator is further provided which is coupled to the magnitude calculator for calculating a through-fault energy value based on the magnitude of current or the calculated current through the transformer. An accumulator is coupled to the through-fault energy calculator for accumulating a plurality of through-fault energy values, and an alarm coupled to the accumulator for indicating that the accumulated through-fault energy values exceed a selected threshold.

24 Claims, 5 Drawing Sheets

U.S. PATENT DOCUMENTS

| | | | |
|---|---|---|---|
| 5,796,258 | A | 8/1998 | Yang |
| 5,963,404 | A | 10/1999 | Guzman-Casillas |
| 6,011,480 | A | 1/2000 | Schweitzer |
| 6,148,267 | A | 11/2000 | Premerlani |
| 6,256,592 | B1 | 7/2001 | Roberts |
| 6,341,055 | B1 | 1/2002 | Guzman-Casillas |
| 6,356,421 | B1 | 3/2002 | Guzman-Casillas |
| 6,411,865 | B1 | 6/2002 | Qin |
| 6,483,680 | B1 | 11/2002 | Kulidjian |
| 6,507,184 | B1 | 1/2003 | Elston |
| 6,518,767 | B1 | 2/2003 | Roberts |
| 6,525,543 | B1 | 2/2003 | Roberts |
| 6,590,397 | B2 | 7/2003 | Roberts |
| 6,642,700 | B2 | 11/2003 | Slade |
| 6,670,721 | B2 | 12/2003 | Lof |
| 7,123,459 | B2 | 10/2006 | Scheitzer |
| 7,196,884 | B2 | 3/2007 | Guzman-Casillas |
| 7,319,576 | B2 | 1/2008 | Thompson |
| 2007/0021937 | A1 | 1/2007 | Labuschagne |
| 2007/0035902 | A1 | 2/2007 | Schweitzer |
| 2007/0070565 | A1 | 3/2007 | Benmouyal |
| 2008/0088466 | A1 | 4/2008 | Labuschagne |
| 2008/0130179 | A1 | 6/2008 | Gajic |
| 2008/0278871 | A1* | 11/2008 | Shaak et al. .............. 361/42 |

FOREIGN PATENT DOCUMENTS

| WO | 2005064759 | 7/2005 |
|---|---|---|

OTHER PUBLICATIONS

Xiangning Lin, Qing Tian, Pei Liu, The Self-Adaptation Compensated Differential Protection of Powerformer, The Department of Electrical Engineering, Huazhong University of Sience and Technology (HUST), Wuhan 430074, China.

Walter A. Elmore, Ways to Assure Improper Operation of Transformer Differential Relays, Consulting Engineer, ABB Power T&D Co., Inc., Coral Spring, Florida, presented to the Forty-Fifth Annual Conference for Protective Relaying Engineering at the Georgia Institute of Technology, Atlanta, Georga, May 1-3, 1991.

Gerald Dalke, Solutions for Unconventional CT Connections, Basler Electric Company, presented before the 59th Annual Georgia Tech Protective Relaying Conference, Atlanta, Georgia, Apr. 27-29, 2005.

Mike Young, John Horak, Commissioning Numerical Relays, Basler Electric Company, 2003.

Zoran Gajic, Igor Ivankovic, Bozidar Filipovic-Grcic, Renata Rubesa, New Method for Differential Protection of Phase Shifting Transformers, Sep. 6, 2006.

Casper Labuschagne, Normann Fischer, Transformer Fault Analysis Using Event Oscillography, Sep. 15, 2006.

Tziouvaras, Demitrios A., Protecting a 138 KV Phase Transformer EMTP Modeling and Model Power System Testing, Nov. 2002.

"Zoran Gajic, Ivo Brncic, Birger Hillstrom, Fahrudin Mekic, Igor Ivankovic, Sensitive Turn-to-Turn Fault Protection for Power Transformers, Cigré Study Committee B5Colloquium, Calgary, Canada, Sep. 2005."

"Ivo Brncic, Zoran Gajic, Torbjorn Einarsson, Transformer Differential Protection Improved by Implementation of Negative-Sequence Currents, ABB Power Technologies, 15thInternational Conference on Power System protection, Bled-Slovenia,Sep. 2006."

Schweitzer Engineering Laboratories, Inc., SEL-787 Transformer Protection Relay, Apr. 7, 2008.

Bill Flemming, Negative Sequence Impedance Directional Element, Feb. 16, 1998.

Fernando Calero, Rebirth of Negative-Sequence Quantities in Protective Relaying with Microprocessor-Based Relays, Oct. 2003.

V. Duraisamy, N. Devarajan, P.S. Vinoth Kumar, S.N. Sivanandam, D. Somasundareswari, A Fuzzy Based Fault Detection Scheme for Synchronous Generator, Mar. 2000.

M.G. Melero, M.F. Cabanas, C. Rojas, F. Pedrayes, G.A. Orcajo, J.M. Cano, Accelerated Ageing Test Applied to the Early Detection of Insulation Failures in Low Voltage Induction Motors, Oct. 2, 2007.

Patent Cooperation Treaty, International Search Report, PCT/US2008/079232, Apr. 16, 2009.

Patent Cooperation Treaty, International Preliminary Report on Patentability, PCT/US2008/079232, Apr. 13, 2010.

Patent Cooperation Treaty, International Search Report, PCT/US2008/079228, Dec. 8, 2008.

Patent Cooperation Treaty, Written Opinion of the International Searching Authority, Dec. 8, 2008.

\* cited by examiner

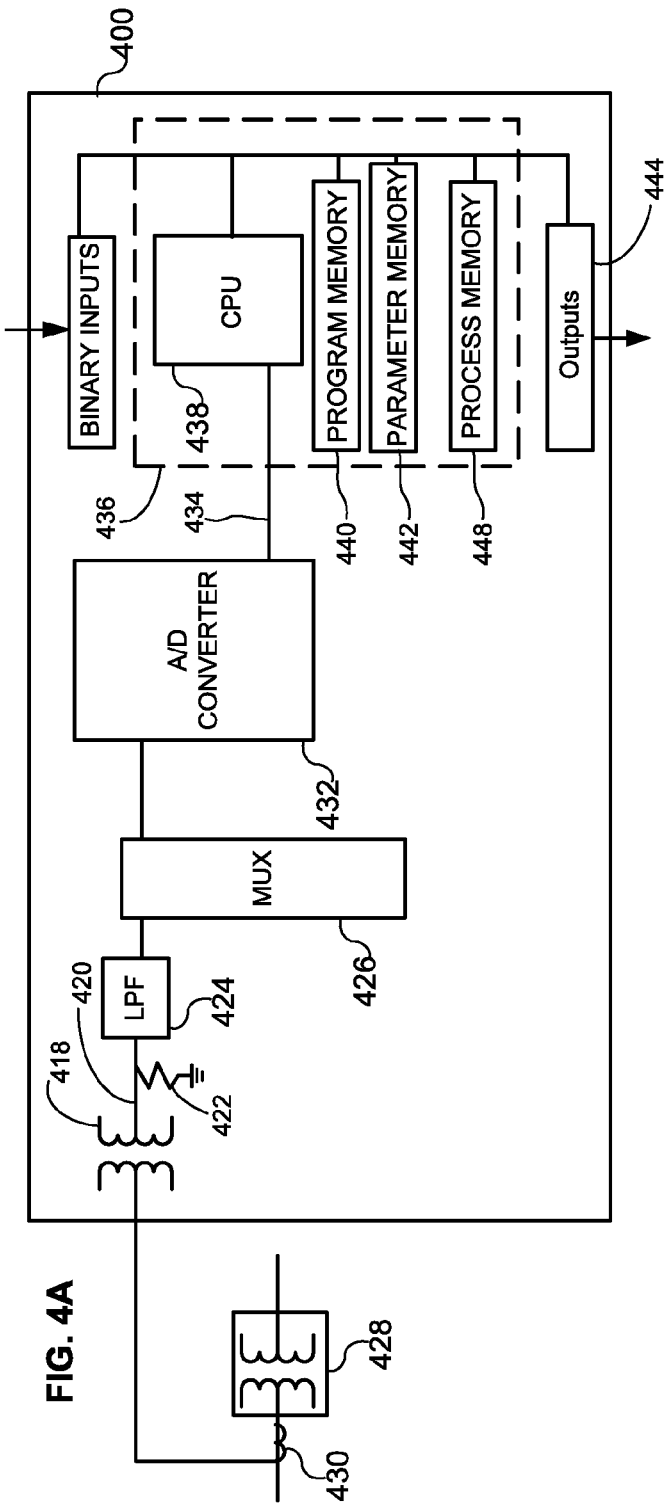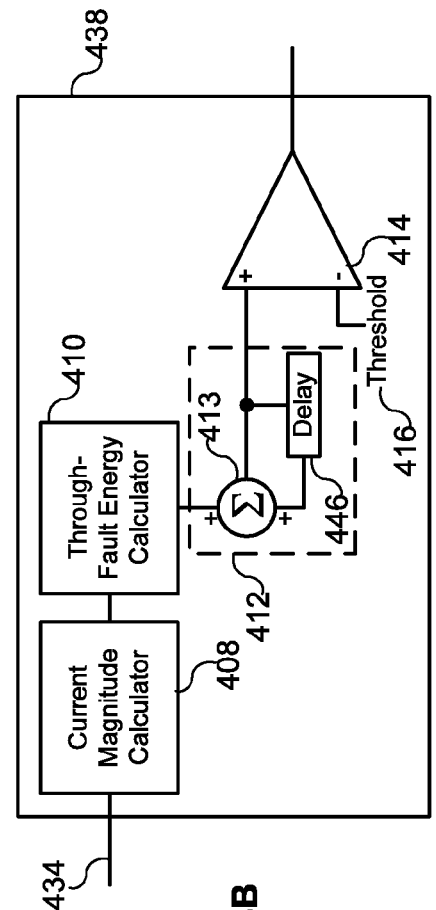
FIG. 4A
FIG. 4B

TRANSFORMER THROUGH-FAULT CURRENT MONITOR

CROSS-REFERENCE TO RELATED APPLICATIONS

This application claims benefit under 35 U.S.C. §119(e) of U.S. Provisional Application Ser. No. 60/978,660, entitled "TRANSFORMER THROUGH-FAULT CURRENT MONITOR," filed Oct. 9, 2007, naming Armando Guzman-Casillas and Normann Fischer as inventors, the complete disclosure thereof being incorporated herein by reference.

FIELD OF THE INVENTION

Electric transformers are devices used in electric power systems which transfer electric energy from one circuit to another through inductively coupled electrical conductors. The present disclosure relates generally to a device for monitoring an electric transformer. More specifically, a device is provided for monitoring through-fault current in an electric transformer.

SUMMARY OF THE INVENTION

A device is provided for monitoring through-fault current in an electric transformer on an electrical power system. The device calculates a measure of magnitude of the measured alternating current, such as a root means square (RMS) value of current of the through current of the transformer. Using the base current (a value derived from settings that are based on the transformer nominal apparent capacity and nominal voltage), the device calculates the per-unit RMS current. The device then calculates the through-fault energy from the per-unit RMS current, and calculates a value representing the accumulated through-fault energy. The accumulated through-fault energy is compared against a threshold to activate an output indicating that the threshold has been exceeded. The device generally includes a magnitude calculator for calculating a value corresponding with a magnitude of the current. The magnitude calculator may be a root means square calculator for calculating a root means square value of current of the electric transformer. Alternatively, another magnitude calculator may be used such as a fundamental calculator for calculating a fundamental component of current and a magnitude of the fundamental component of current. A through-fault energy calculator is further provided which is coupled to the magnitude calculator for calculating a through-fault energy value based on the magnitude value of current through the transformer. An accumulator is coupled to the through-fault energy calculator for accumulating a plurality of through-fault energy values. The device may further include an alarm coupled to the accumulator for indicating that the accumulated through-fault energy values exceed a selected threshold. The device may further be adapted to provide a control signal to a power system element (e.g., circuit breaker) to isolate the transformer from the power system if the accumulated through-fault energy values exceed a selected threshold.

A method is further provided for monitoring an electric transformer including the steps of sampling a signal waveform on the high and/or low sides of the transformer; calculating the per unit current of the electric transformer; calculating a magnitude of the current such as calculating a root means square value of current based on the calculated current of the electric transformer or calculating a magnitude of a fundamental of the current based on the calculated current of the electric transformer; calculating a through-fault energy value based on magnitude value of current or the calculated current through the transformer; accumulating a plurality of through-fault energy values; and determining whether the accumulated through-fault energy values exceed a selected threshold. The method may further provide an alarm or a control signal to a power system element (e.g., circuit breaker) to isolate the transformer from the power system if the accumulated through-fault energy values exceed a selected threshold.

BRIEF DESCRIPTION OF THE DRAWINGS

FIG. 4A is a block diagram of an IED monitoring a transformer and its internal architecture.

FIG. 4B is a diagram of the internal architecture for an IED for monitoring through-fault current in a transformer.

DESCRIPTION OF THE PREFERRED EMBODIMENTS

Transformers generally include a set of windings around a magnetic core, where the windings are insulated from each other and the core. In this arrangement, current in a primary winding may be changed to induce a change in the voltage in a secondary winding. Moreover, an addition of a load to the secondary winding may cause current to flow through the transformer, thereby transferring energy from the primary winding to the secondary winding. Additionally, the number of turns in each of the windings may be adjusted to allow an alternating voltage to be stepped up or stepped down. Stepping up voltage allows for transmission of electrical power over long distances. Stepping down voltage allows such electrical power to be lowered such that it may be safely used by an end user.

Figure 1:
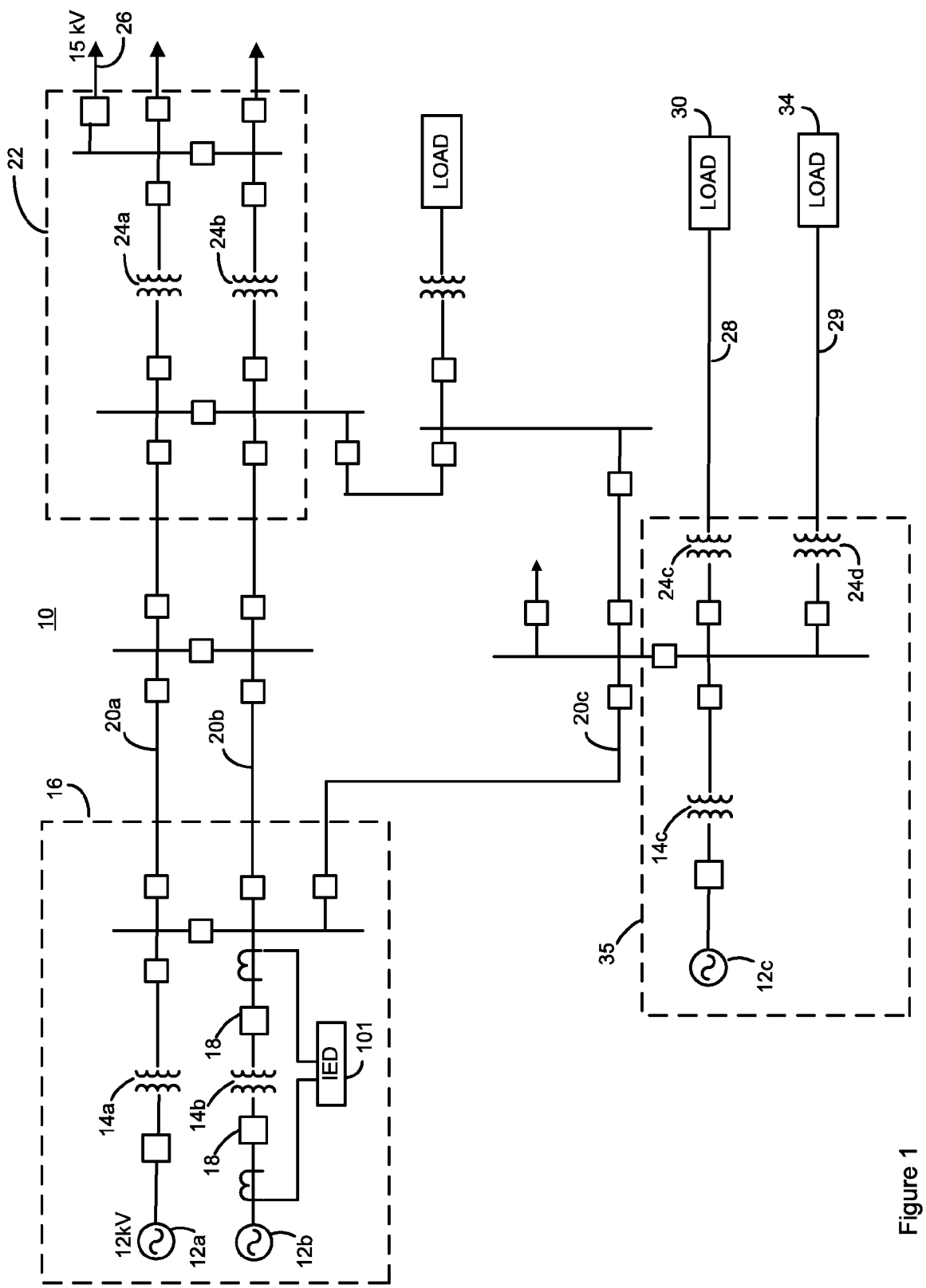
FIG. 1 is a one-line diagram of a power system.

A device is provided for monitoring through-fault current in an electric transformer on an electrical power system. FIG. 1 is a single-line diagram which illustrates a device 101 in an electric power system 10. The electric power system 10 includes three substations 16, 22, 35. Substation 16 includes two generators 12a and 12b, each configured to generate three-phase sinusoidal waveforms such as 12 kV sinusoidal waveforms. Substation 16 also includes two step-up transformers 14a and 14b configured to increase the generated waveforms to higher voltage sinusoidal waveforms such as 138 kV sinusoidal waveforms. Substation 35 includes a similar generator 12c and step-up transformer 14c. The higher voltage sinusoidal waveforms are carried for long distance distribution purposes to substations and/or loads 30, 34 and/or distribution lines 26 via transmission lines 20a, 20b, 20c, 28 and 29. Before reaching distribution lines 26 or loads 30, 34, however, the higher voltage is stepped down to a lower voltage such as, for example, 15 kV via step-down transformers 24a, 24b, 24c, and 24d so that the electrical power is usable by an end user.

The transformers of the electric power system 10 may be generally monitored and protected using an intelligent electronic device. The IED may be in the form of a protective relay or any other power system monitoring or protection device. For example, IED 101 may be adapted to monitor the through-fault current in transformer 14b using signals sampled on either side of transformer 14b. Furthermore, IED 101 may further be adapted to provide control signals to various power system elements associated therewith. For example, IED 101 may be adapted to provide a control signal to circuit breakers 18 on either side of the transformer 14b to isolate it from the electric power system 10 during transformer failure.

During operation of a transformer, several stresses may be placed on the windings, insulation and/or core which may cause failure of the transformer. Forces that cause stresses on the various parts of the transformer include, for example, expansion and contraction caused by thermal cycling; vibration caused by changes in flux in the core with each half-cycle of the sinusoidal waveform; localized heating caused by eddy currents in parts of the winding; impact forces caused by though-fault currents; and thermal heating caused by overload. Exposure to such stresses causes accelerated failure of the windings, insulation, and core. The cumulative effect of these stresses on the transformer is taken into consideration when determining the life expectancy of a transformer. The ANSI and IEEE provide standard operating limits for power transformers in the form of through-fault protection curves. For example, IEEE C57.109-1993, incorporated by reference herein and made a part hereof, provides curves which may be used to determine the maximum through-fault current duration for various categories of liquid-immersed transformers. There are generally four classes of transformers as shown in Table 1.

TABLE 1

| CLASS | SINGLE PHASE KVA | THREE PHASE KVA |
|---|---|---|
| I | 5 to 500 | 15 to 500 |
| II | 501 to 1667 | 501 to 5000 |
| III | 1668 to 10000 | 5001 to 30000 |
| IV | Above 10000 | Above 30000 |

ANSI and IEEE provide curves for each of the transformer classes which show a thermal duty limit curve and a mechanical duty limit curve. For example, for Class II transformers, the mechanical duty limit curve begins at about 70% of the maximum short circuit current. For Class III and Class IV transformers, the mechanical duty limit curve starts at about 50% of the maximum short-circuit current.

Figure 2:
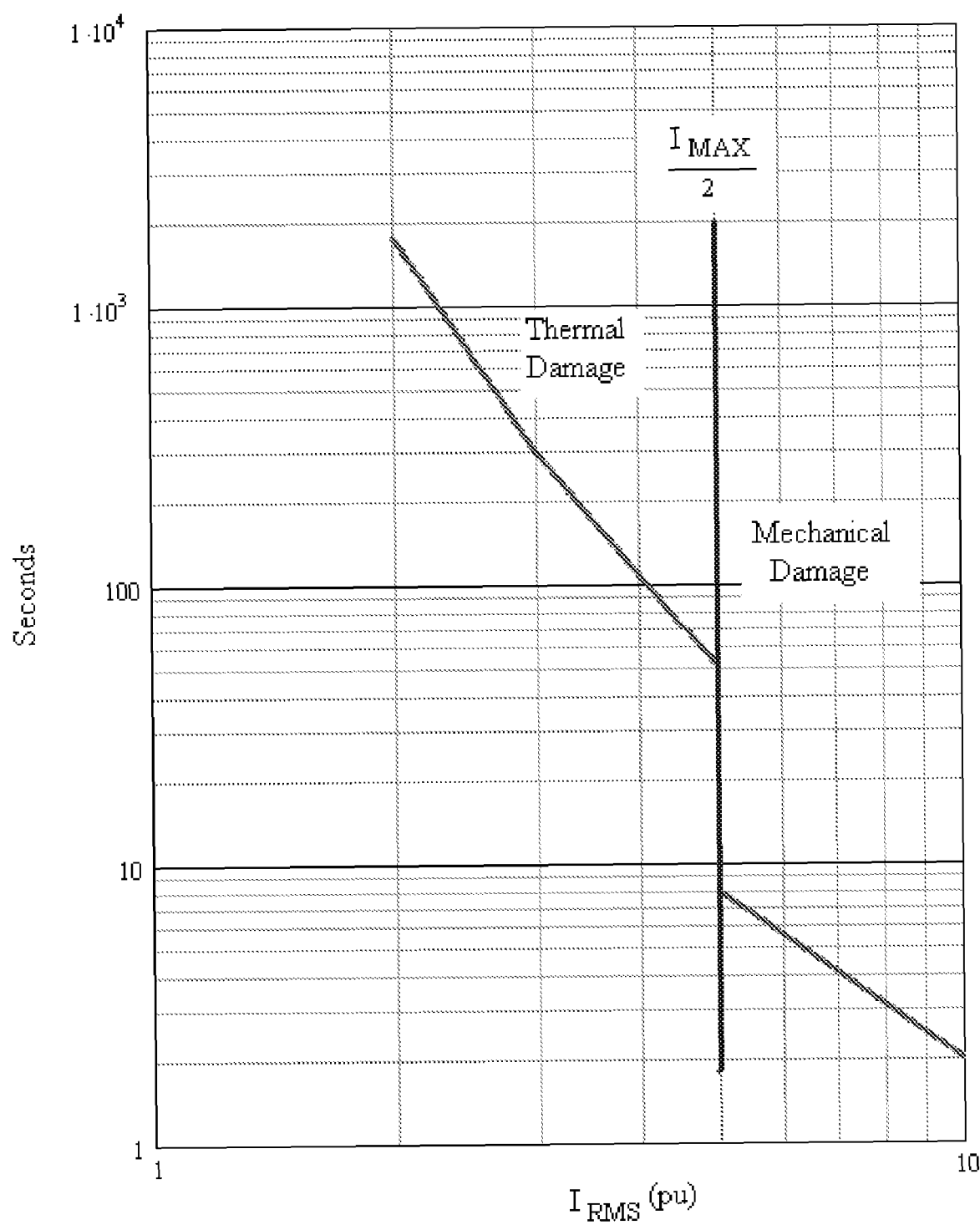
FIG. 2 is an example of a transformer through-fault protection curve for a three-phase Class IV transformer.

FIG. 2 illustrates an example of a protection curve for a three-phase Class IV transformer having an impedance ZT=0.10 pu. This protection curve depends on the transformer impedance when the fault current exceeds about 50% of the maximum fault current, IRMS=10. The protection curve is generally divided into the thermal stress protection portion to the left of the 50% line and the mechanical stress protection to the right of the 50% line. Again, it is to note that there are other protection curves for the other classes of transformers which show their respective thermal and mechanical stress protection portions.

To provide through-fault monitoring, through-fault current energy may be integrated with respect to time using Equations 1 through 5

$$\int_0^{T_0} \frac{1}{t(I_{RMS\_pu})} \cdot dt = 1 \qquad (1)$$

where $T_0$ is the time to exceed the transformer through-fault curve; $I_{RMS\_pu}$ is the per-unit value of the measured root mean squared (RMS) transformer current.

$$t(I_{RMS}) = \frac{K}{I_{RMS\_pu}^2} \qquad (2)$$

where, for Class IV transformers, the constant K takes the following values:

$$K = 1250 \text{ for } 4.75 < I_{RMS\_pu} \le \frac{I_{MAX}}{2} \qquad (3)$$

$$K = 2 \cdot I_{MAX}^2 \text{ for } I_{RMS\_pu} > \frac{I_{MAX}}{2} \qquad (4)$$

where $I_{MAX}$ is the per-unit maximum transformer through-fault current, given by:

$$I_{MAX} = \frac{1}{Z_T} \qquad (5)$$

where $Z_T$ is the transformer per-unit impedance. Again, it is to note that the values used in Equations 1-5 are for example purposes only as they are specific to Class IV transformers. There are other values associated with the other classes of transformers which are associated with their respective protection curves which may be used to calculate the through-fault energy for that particular class of transformer.

Figure 3:
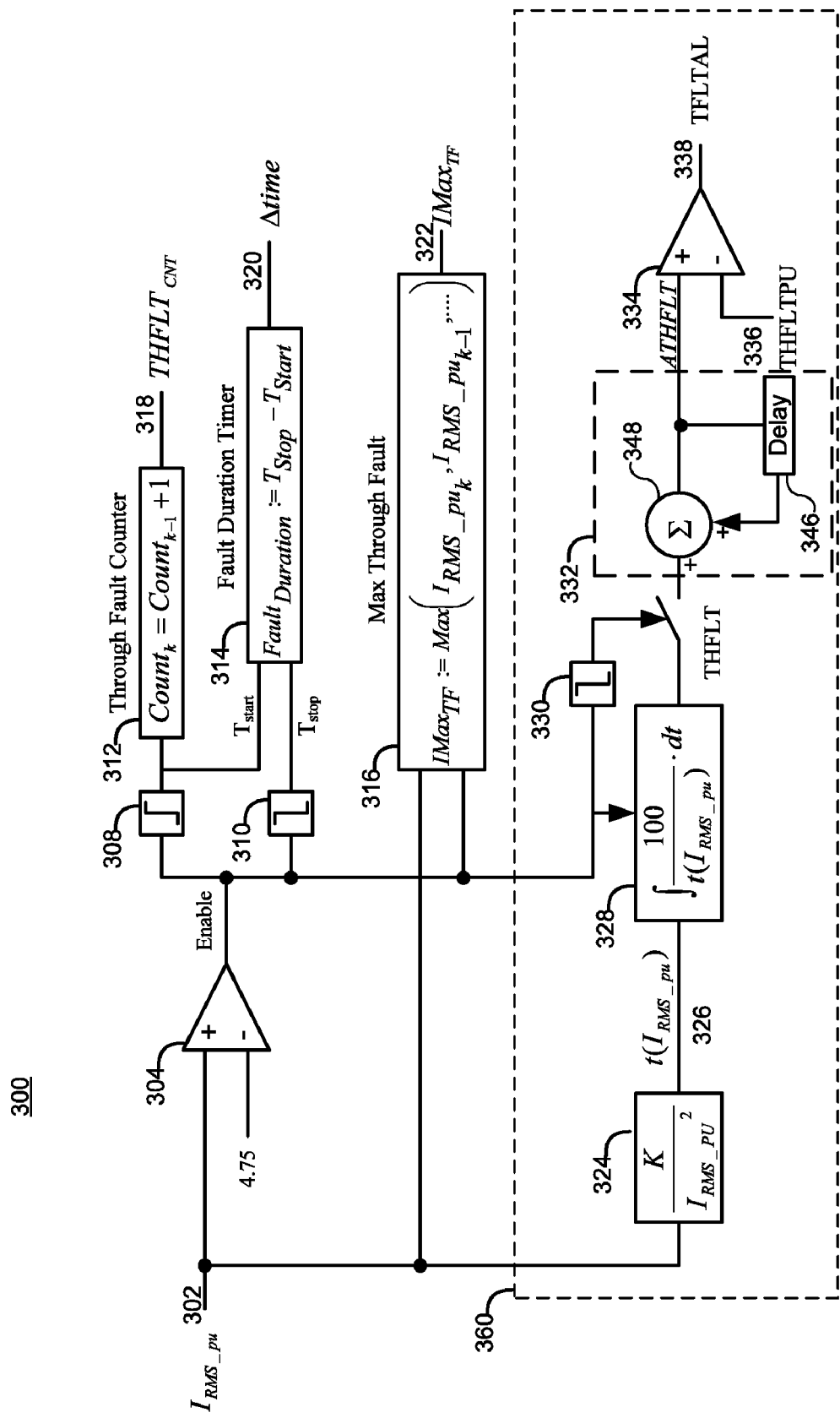
FIG. 3 is a block diagram for a module for an IED for monitoring through-fault current in a transformer.

FIG. 3 illustrates logic and calculations 300 which may be implemented into an IED (e.g., IED 101 of FIG. 1) for through-fault current monitoring. A signal waveform on the high and/or low sides of the transformer is sampled by a sampling circuit. A magnitude calculator calculates the magnitude of the current based on the calculated current flowing through the electric transformer. For example, the magnitude calculator may be adapted to calculate a root means square value of current (IRMS) based on the calculated current. A through-fault energy calculator calculates through-fault energy values based on the magnitude or root means square value of current through the transformer. The plurality of through-fault energy values is accumulated by an accumulator, and an alarm or control signals are initiated if the accumulated through-fault energy values exceed a selected threshold.

The logic and calculations 300 calculates IRMS and a plurality of through-fault energy values by applying Equations 1-5. More specifically, a root means square calculator calculates IRMS_pu 302 from a signal waveform sampled from the high and/or low sides of an associated transformer. In one branch of the logic and calculations 300, the calculated IRMS_pu 302 is compared against a selected threshold by comparator 304. The threshold may be selected at a point at which mechanical stress is placed on the transformer. For example, for a Class IV transformer, the threshold may be selected as 4.75, that is 47.5% of IMAX. If IRMS_pu 302 is greater than the selected threshold, then a through-fault counter 312 and fault duration timer 314 are enabled. The through-fault counter 312 is started at a rising edge (provided by a rising edge detector 308), and increments its count each time that a through-fault is detected wherein IRMS_pu is greater than the selected threshold (e.g., greater than 4.75 for Class IV transformers) and there is a rising edge at the input of rising edge detector 308. The count is available on output 318. The fault duration timer 314 begins timing at the assertion of the rising edge detector 308 and ends timing at the assertion of the falling edge detector 310 indicating that IRMS_pu is no longer greater than the selected threshold (e.g., less than 4.75 for Class IV transformers). The time is available on output 320.

IRMS_pu 302 is also available to the maximum through-fault detection 316, which is enabled by comparator 304 when IRMS_pu is greater than the selected threshold (e.g., greater than 4.75 for Class IV transformers). The maximum through-fault detection 316 determines the maximum IRMS_pu value when it is enabled. The maximum through-fault value is available on output 322.

IRMS_pu 302 is further available to the through-fault alarm module 360. The through-fault alarm module 360 calculates the through-fault energy values function t(IRMS_pu) 326 using Equation (2) in calculator 324. Calculator 328 then uses Equation (1) to determine the through-fault energy indication as a percentage THFLT. This indication is applied to accumulator 332 when the falling edge detector 330 asserts (i.e. when IRMS_pu is no longer greater than the selected threshold). Accumulator 332 may include an adder 348 configured to add the present THFLT value to the previous output of the adder using a delay 346. The delay 346 may be a one-processing-cycle delay. Thus, while the energy THFLT is constantly being calculated (while the enable output of 304 is true), the value is only provided to the accumulator 332 when IRMS_pu is no longer greater than the selected threshold. The output of the accumulator 332 is available to the comparator 334 which compares the accumulated energy (as a percentage) against a user-defined through-fault pickup threshold THFLTPU 336. When the energy percentage exceeds the pickup threshold 336, then an alarm may be set 338 (TFLTAL). For example, the threshold 336 may be set to 80 percent to indicate that the accumulated through-fault energy operating point is approaching the protection curve limit. The logic and calculations may further be adapted to provide a control signal to a power system element (e.g., a circuit breaker) for isolating the transformer from the power system when the energy percentage exceeds the pickup threshold 336. Another practical application of this logic is to use the integrator output THFLT as the fault severity indicator. The fault severity indicator can supervise feeder reclosing in distribution substations. For example, upon output of the THFLT signal, reclosing relays may be blocked from reclosing the transformer into use.

Accordingly, logic and calculations 300 of FIG. 3 or any similar logic may be implemented into a power system device (e.g., an IED or protective relay) in order to provide monitoring of through-fault current in an electric transformer on an electrical power system. For example, in an alternative algorithm, the fundamental current may be used instead of the root means square of current to calculate the through-fault energy without deviating from the spirit of the invention.

FIG. 4 is an illustration of a device 400 including a microprocessor 438 for processing logic for monitoring through-fault current in an electric transformer 428. The device 400 includes an input from a current transformer 430 in communication with the monitored transformer 428. In the illustrated configuration, the current transformer 430 is in connection with the low side of the monitored transformer 428. The current transformer 418 (and a resistor 422 for converting the current signal to voltage signal) may be configured to proportionally step-down the current to a secondary current waveform having a magnitude that can be readily monitored and measured by the device 400. Low pass filter 424 filters the secondary waveform. As the device may receive several inputs from current transformers (not separately illustrated), the filtered signal is then brought into a multiplexer 426, and follows to an A/D converter 432 to sample and digitize the filtered waveforms to form a corresponding digitized current signal 434.

The digitized current signal 434 is received by a microcontroller 436 configured to perform digital signal processing. In one embodiment, the microcontroller 436 includes a central processing unit (CPU) or microprocessor 438, a program memory 440 (e.g., a Flash EPROM), a parameter memory 442 (e.g., an EEPROM) and a process memory 448 (such as, for example, RAM). As will be appreciated by those skilled in the art, other suitable microcontroller configurations may be used. Further, although discussed in terms of a microcontroller, it should be noted that the embodiments disclosed herein may be practiced using a field-programmable gate array (FPGA), application specific integrated circuit (ASIC), or other programmable logic device.

The microprocessor 438, by executing a computer software program or logic scheme, processes the digitized current signal 434 according to the methods described herein. The microprocessor 438 may also provide outputs 444 based on the results of the calculations and digital signal processing.

FIG. 4B illustrates a more detailed architecture of the logic that may be operated in the microprocessor 438. The microprocessor 438 process a program that includes a magnitude calculator 408 for calculating the magnitude of current based on the signal waveform. For example, the magnitude calculator 408 may be adapted to implement the equations and logic as outlined above in order to calculate the root means square value of current (IRMS). A through-fault energy calculator 410 is further provided which is coupled to the magnitude calculator 408 for calculating a through-fault energy value based on the magnitude of current through the transformer 428. The through-fault energy calculator 410 may be adapted to implement the equations and logic as outlined above. An accumulator 412 is coupled to the through-fault energy calculator 410 for accumulating a plurality of through-fault energy values. The accumulator 412 may include an adder 413 and a delay 446. The output of the adder 413 may be fed into a delay 446, the output of which then leads back into the adder 413. The delay 446 may be a one-processing-cycle delay such that the immediate past accumulated value is added to the present energy value to provide the accumulated value. The accumulated through-fault energy values are compared (at comparator 414) to a selected threshold 416. The device 400 may further include an alarm (not shown) coupled to the comparator for indicating that the accumulated through-fault energy values exceed a selected threshold. The device 400 may further be adapted to provide a control signal to a power system element (e.g., circuit breaker) to isolate the transformer 428 from the power system if the accumulated through-fault energy values exceed a selected threshold. The output of the comparator 414 may be a contact output that may be used for monitoring, protection, control and/or automation of the transformer 428.

Where a value of the magnitude of the fundamental of the current through the transformer is used instead of the RMS value of current, the magnitude calculator 408 may include a fundamental frequency filter for filtering all frequencies except for the fundamental. A magnitude calculator may then be used to calculate the magnitude of the fundamental frequency from the filtered signal, providing a magnitude of the fundamental of the current. It should be noted that harmonics other than the fundamental may be used.

Figure 5:
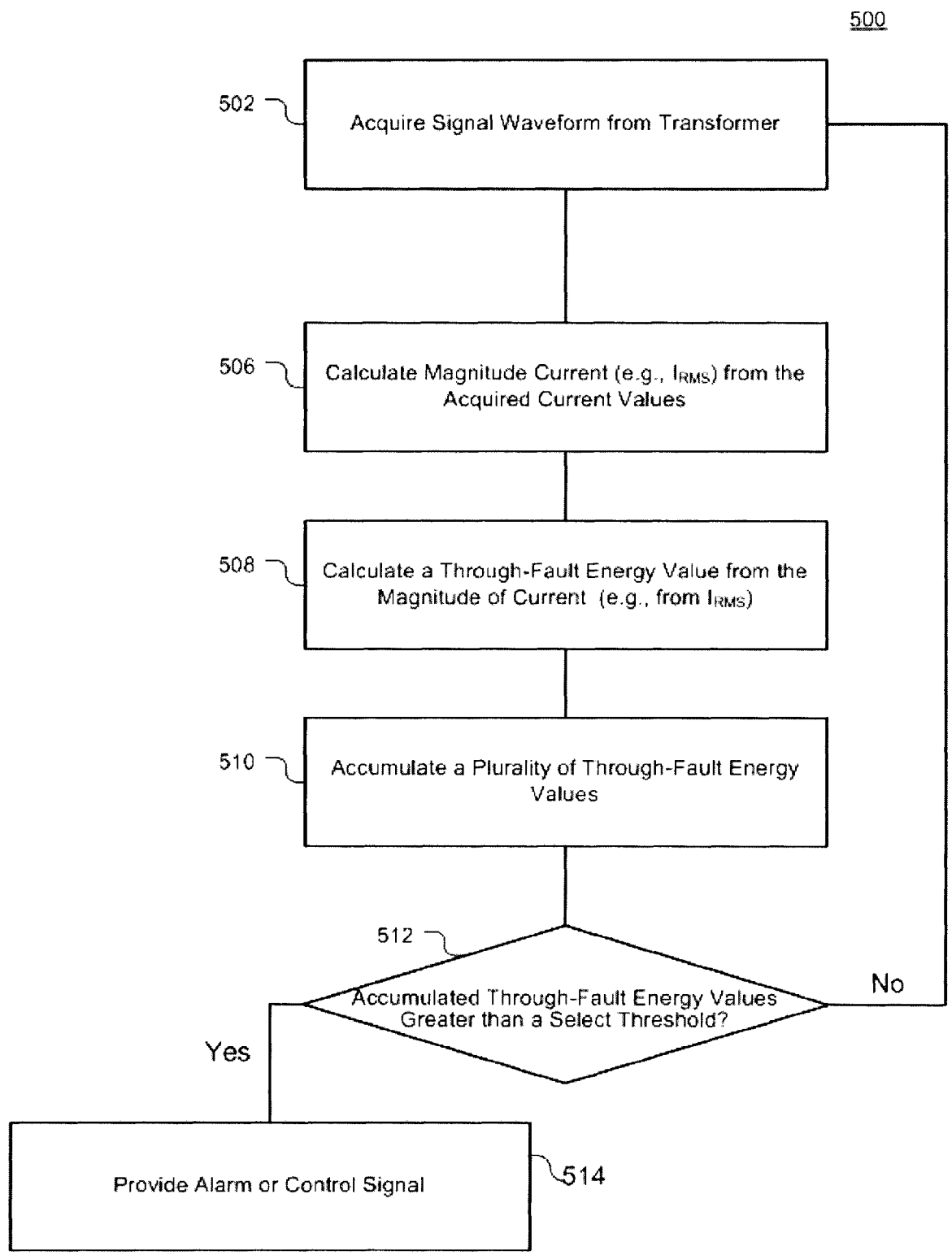
FIG. 5 is a flowchart illustrating a method for monitoring through-fault current in a transformer.

FIG. 5 is a flowchart outlining a method 500 for monitoring through-fault current in an electric transformer. In this method, a signal waveform is acquired from the transformer (step 502). The magnitude of current is calculated based on the calculated current through the electric transformer (step 506). For example, the magnitude calculation may include the calculation of the root means square value of current using the equations as outlined above. A through-fault energy value is calculated based on the root means square value of current through the transformer (step 508) using the equations as outlined above. A plurality of through-fault energy values are accumulated (step 510) and compared to a selected threshold (step 512). An alarm or control signal may be provided if the accumulated through-fault energy values exceed a selected threshold (step 514). In an alternative method, the fundamental current may be used instead of the root means square of current to calculate the through-fault energy without deviating from the spirit of the invention.

Although the embodiments described above use RMS values of current and per-unit RMS values of current, other calculations of the magnitude of the alternating current waveform may be used, such as, for example, the fundamental of the waveform may be calculated instead of the RMS value. In such cases, the RMS values and calculators would then be replaced by the alternate values and calculators described and illustrated herein.

While this invention has been described with reference to certain illustrative aspects, it will be understood that this description shall not be construed in a limiting sense. Rather, various changes and modifications can be made to the illustrative embodiments without departing from the true spirit, central characteristics and scope of the invention, including those combinations of features that are individually disclosed or claimed herein. For example, although an example of a Class IV transformer is provided. The various aspects of the present invention may be similarly applied to Class I, Class II or Class III transformers without deviating from the spirit of the present invention. Furthermore, it will be appreciated that any such changes and modifications will be recognized by those skilled in the art as an equivalent to one or more elements of the following claims, and shall be covered by such claims to the fullest extent permitted by law.

We claim:

1. A device for monitoring through-fault current in an electric transformer on an electrical power system, the electric transformer having a signal waveform therethrough, the device including:
    a magnitude calculator adapted to calculate a magnitude value of current from the signal waveform based on the current flowing through the electric transformer,
    a through-fault energy calculator coupled to the magnitude calculator adapted to calculate a through-fault energy value based on the magnitude value of current through the transformer, and
    an accumulator coupled to the through-fault energy calculator for accumulating a plurality of through-fault energy values.

2. The device of claim 1, wherein the magnitude calculator comprises a root means square calculator configured to calculate a root means square value of current, and wherein the magnitude value is the root means square value.

3. The device of claim 1, wherein the magnitude calculator comprises a fundamental calculator configured to calculate a fundamental value of current, and wherein the magnitude value is the fundamental value.

4. The device of claim 1 wherein the accumulator begins accumulating through-fault energy values if the magnitude value of current exceeds a selected threshold.

5. The device of claim 4 wherein the transformer is a Class IV type transformer.

6. The device of claim 1 wherein the accumulator begins accumulating through-fault energy values if the magnitude value of current is greater than about 4.75 per unit.

7. The device of claim 1 further comprising an alarm coupled to the accumulator for indicating that the accumulated through-fault energy values exceed a selected threshold.

8. The device of claim 7 wherein the alarm is initiated if the accumulated through-energy value exceeds about 80%.

9. The device of claim 1 wherein the through-fault energy value is used as a fault severity indicator.

10. The device of claim 1 wherein the device is further adapted to provide a control signal to a power system element for isolating the transformer from the power system when the accumulated through-fault energy values exceed a selected threshold.

11. The device of claim 1, further comprising a comparator in communication with the accumulator, configured to compare the accumulated value against a predetermined threshold.

12. The device of claim 11, further comprising an output in communication with the comparator configured to block a reclosing operation when the accumulated value exceeds the predetermined threshold.

13. A method for monitoring an electric transformer on an electric power system, the electric transformer having a signal waveform therethrough, the method including the steps of:
    sampling a signal waveform on either side of the transformer;
    calculating a magnitude value of current based on the current through the electric transformer;
    calculating a through-fault energy value based on the magnitude value of current through the transformer;
    accumulating a plurality of through-fault energy values; and
    determining whether the accumulated through-fault energy values exceed a selected threshold.

14. The method of claim 13 further including the step of providing an alarm if the accumulated through-fault energy values exceed a selected threshold.

15. The method of claim 13 further including the step of providing a control signal to a power system element to isolate the transformer from the power system if the accumulated through-fault energy values exceed a selected threshold.

16. The method of claim 13, wherein the step of calculating a magnitude value comprises calculating a root means square value, and the magnitude value is the root means square value.

17. The method of claim 13, wherein the step of calculating a magnitude value comprises calculating a fundamental value, and the magnitude value is the fundamental value.

18. A device for monitoring through-fault current in an electric transformer on an electrical power system, the electric transformer having a signal waveform therethrough, the device including:
    a through-fault energy calculator adapted to calculate a through-fault energy value based on the signal waveform, and
    an accumulator coupled to the through-fault energy calculator for accumulating a plurality of through-fault energy values.

19. The device of claim 18 further comprising a current magnitude calculator configured to calculate a magnitude of current through the electric transformer from the signal waveform, wherein the accumulator begins accumulating through-fault energy values if the magnitude exceeds a selected threshold.

20. The device of claim 19, wherein the magnitude calculator comprises a root means square calculator.

21. The device of claim 18 further comprising an alarm coupled to the accumulator for indicating that the accumulated through-fault energy values exceed a selected threshold.

22. The device of claim 21 wherein the alarm is initiated if the accumulated through-energy value exceeds about 80%.

23. The device of claim 18 wherein the through-fault energy value is used as a fault severity indicator.

24. The device of claim 18 wherein the device is further adapted to provide a control signal to a power system element for isolating the transformer from the power system when the accumulated through-fault energy values exceed a selected threshold.

* * * * *